United States Patent
Luo

(10) Patent No.: US 6,251,730 B1
(45) Date of Patent: Jun. 26, 2001

(54) SEMICONDUCTOR POWER DEVICE MANUFACTURE

(75) Inventor: JiKui Luo, Cardiff (GB)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/348,960

(22) Filed: Jul. 7, 1999

(30) Foreign Application Priority Data

Jul. 11, 1998 (GB) .................................................. 9815021

(51) Int. Cl.⁷ .................................................. H01L 21/336
(52) U.S. Cl. .......................... 438/270; 438/564; 438/589; 438/596
(58) Field of Search ...................................... 438/270, 271, 438/268, 272, 589, 596, 564; 257/330

(56) References Cited

U.S. PATENT DOCUMENTS

| | | | |
|---|---|---|---|
| 5,270,257 | * 12/1993 | SHin | 438/589 |
| 5,300,447 | * 4/1994 | Anderson | 438/589 |
| 5,324,971 | 6/1994 | Notley | 257/328 |
| 5,371,024 | * 12/1994 | Hieda et al. | 438/589 |
| 5,374,571 | * 12/1994 | Mukherjee et al. | 438/270 |
| 5,378,655 | 1/1995 | Hutchings et al. | 437/203 |
| 5,665,619 | 9/1997 | Kwan et al. | 438/270 |
| 5,684,319 | * 11/1997 | Hebert | 438/270 |
| 5,864,167 | 1/1999 | Cutter | 257/489 |

\* cited by examiner

Primary Examiner—Michael Trinh
(74) Attorney, Agent, or Firm—Steven R. Biren

(57) ABSTRACT

In the manufacture of a semiconductor power device such as a trench-gate power MOSFET, a source region (13) is formed using a sidewall extension (30) of an upstanding insulated-gate structure (11,21,22). The sidewall extension (30) forms a step with an adjacent surface area (10a') of a body region (15) of a first conductivity type and comprises doped semiconductor material (13a) of opposite, second conductivity type which is separated from the gate (11) by insulating material (22). The body region (15) provides a channel-accommodating portion (15a) adjacent to the gate structure (11,21,22) and also comprises a localised high-doped portion (15b) which extends to a greater depth in the semiconductor body (10) than the shallow p-n junction between the source region (13) and the channel-accommodating portion (15a), and preferably deeper even than the bottom of the trench (20) of a trench-gate device. This high-doped portion (15b) is formed by introducing dopant of the first conductivity type into the semiconductor body (10) via the stepped-down adjacent surface area (10a') while using the stepped-up sidewall extension (30) comprising the doped source region material (13a) to mask the underlying channel area. Source electrode material (33) is deposited over the step so as to contact the doped semiconductor material (13a) of the sidewall extension (30) and the adjacent surface area (10a') of the high-doped portion (15b).

10 Claims, 4 Drawing Sheets

SEMICONDUCTOR POWER DEVICE MANUFACTURE

BACKGROUND OF THE INVENTION

This invention relates to methods of manufacturing a semiconductor power device having a source region formed using a sidewall extension of an upstanding gate structure, particularly, but not exclusively, comprising a trench-gate. The device may be, for example, an insulated-gate field-effect power transistor (hereinafter termed MOSFET) or an insulated-gate bipolar transistor (hereinafter termed IGBT). The invention also relates to semiconductor devices manufactured by such a method.

In manufacturing a trench-gate power device by a method as disclosed in United States patent specification U.S. Pat. No. 5,378,655 (our reference PHB 33836), an upstanding gate structure is formed at a major surface of a semiconductor body, and a sidewall extension (also termed a "spacer") is provided at upstanding sides of the gate structure to form a step with an adjacent surface area of a body region of a first conductivity type. The body region of the first conductivity type extends adjacent to the gate structure to provide the device with a channel-accommodating portion, to which the gate is capacitively coupled. In one embodiment, the sidewall extension comprises doped semiconductor material of opposite, second conductivity type which is separated from the gate by insulating material and which provides a source region of the device. The channel-accommodating portion forms a p-n junction with the source region. A source electrode is deposited over the step so as to contact the doped semiconductor material of the sidewall extension and the adjacent surface area of the first conductivity type.

In this method of U.S. Pat. No. 5,378,655 the source region is self-aligned with the trench-gate, by means of the spacers. Two types of embodiment are disclosed. In the first type, the initially-formed spacer is an etchant mask on part of a surface region of the second conductivity type in the body, and exposed areas of the surface region are then etched away to leave a remaining portion of the second conductivity type under the mask as the source region. In the second type, the spacer is of doped material (for example, doped polycrystalline silicon, or a doped oxide or glass) and serves as a dopant diffusion source for diffusing the dopant of the second conductivity type into the semiconductor body to form the source region.

United States patent specification U.S. Pat. No. 5,665,619 discloses a different trench-gate device process in which a spacer (sidewall extension) of insulating material (undoped oxide) is provided on part of a previously-formed source region so as to define a contact window that is self-aligned to the upstanding insulated trench-gate structure. A high-doped portion is then formed in the body by a blanket implant of dopant of the first conductivity type. This high-doped portion has a doping concentration of said first conductivity type which is higher than that of the channel-accommodating portion but lower than the conductivity-determining dopant concentration of the source region. The source region overdopes the ends of the high-doped portion which extends to a shallower depth in the body than the p-n junction between the source region and the channel-accommodating portion of the body region. At the self-aligned contact window, the source electrode contacts the high-doped portion of the body region of the first conductivity type and the adjacent surface area of the source region of the second conductivity type. No such separately-provided high-doped portion of the body region is described in the devices disclosed in U.S. Pat. No. 5,378,655. The whole contents of both U.S. Pat. No. 5,378,655 and U.S. Pat. No. 5,665,619 are hereby incorporated herein as reference material.

SUMMARY OF THE INVENTION

It is an aim of the present invention to provide a method of manufacturing a trench-gate power device which has a source region that is defined by a sidewall extension at the sides of an upstanding insulated trench-gate structure and which has a localised high-doped portion of its body region that is provided, in a self-aligned manner, to a greater depth in the semiconductor body than the p-n junction between the source region and the channel-accommodating portion of the body region.

While forming the localised high-doped portion by dopant introduction, the sidewall extension (comprising the doped semiconductor material of the source region) is used to mask the underlying area of the body where the channel is accommodated. The channel-accommodating portion is protected in this way from the high doping concentration of the localised high-doped portion, so that the channel threshold voltage of the device is not adversely affected. Such a self-aligned process in accordance with the invention readily permits the localised high-doped portion of the first conductivity type to be provided to a greater depth in the semiconductor body than the p-n junction between the source region and the channel-accommodating portion of the body region. This arrangement improves the current flow from deep in the body region to the source electrode. Thereby, the source electrode provides an efficient ohmic contact to the body region, and parasitic bipolar transistor action in the device is reduced, so improving the ruggedness of the device.

The greater depth relationship between the said localised high-doped portion and said p-n junction is achieved by means of the step-up and step-down associated with the source region which comprises the doped semiconductor material of the sidewall extension at the upstanding sides of the gate structure. Thus, the localised high-doped portion of the body region is formed by introducing dopant via the surface area adjacent to the bottom of the step, while using this step (the sidewall extension) as a mask that comprises the doped semiconductor material for the source region.

Accordingly, the depth of the locally-provided high-doped portion in the semiconductor body is determined with respect to this adjacent surface area at the step-down level, whereas the thickness of the source region is determined with respect to the step-up level of the doped semiconductor material of the sidewall extension. This permits the realisation of a device with a very shallow depth for the p-n junction between the source region and the channel-accommodating portion, while using doped semiconductor material of high conductivity in the step so as to avoid a high resistance in this shallow source region. It also permits the depth of the channel-accommodating portion of the body region itself to be made shallow. A shallow channel-accommodating portion means that the device can be made with a short channel length and with a low on-resistance.

Furthermore, the method permits the realisation of an even greater depth for the localised high-doped portion of the body region. Thus, by appropriately designing the height of the step in accordance with the invention, the localised high-doped portion may be provided to a greater depth in the semiconductor body than the channel-accommodating portion or even to a greater depth in the semiconductor body than the bottom of a trench-gate, for example. These arrangements permit the breakdown voltage of the device to be determined by avalanche breakdown of a deep p-n junction between this deep localised high-doped portion and the underlying body portion of the second conductivity type, rather than by avalanche breakdown of a p-n junction between the shallow body region and the underlying body portion or by breakdown at a bottom corner of the trench as may otherwise occur with some trench-gate device designs.

BRIEF DESCRIPTION OF THE DRAWING

These and other advantageous features in accordance with the invention will now be illustrated in embodiments of the present invention, now to be described with reference to the accompanying diagrammatic drawings, in which.

Figure 1:
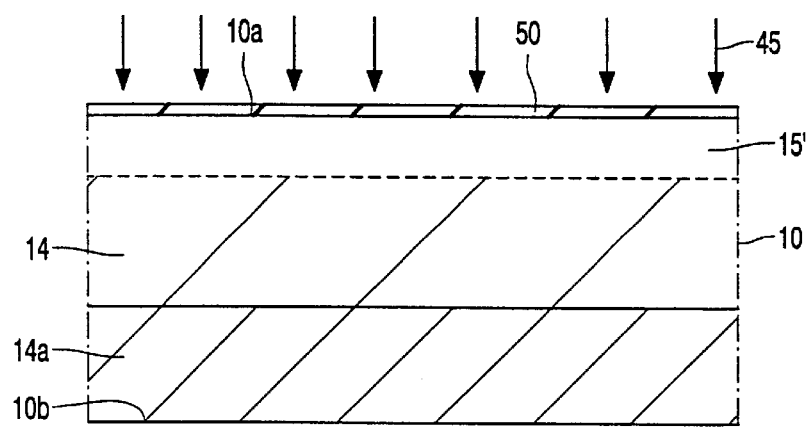
FIGS. 1 to 10 are a cross-sectional view of transistor cell areas of a semiconductor body at successive stages in the manufacture of a trench-gate semiconductor device by one example of a method in accordance with the present invention.

It should be noted that all the Figures are diagrammatic and not drawn to scale. Relative dimensions and proportions of parts of the drawings have been shown exaggerated or reduced in size, for the sake of clarity and convenience in the drawings. The same reference signs are generally used to refer to corresponding or similar features in different stages of manufacture and in modified and different embodiments.

DESCRIPTION OF THE PREFERRED EMBODIMENT

Figure 10:
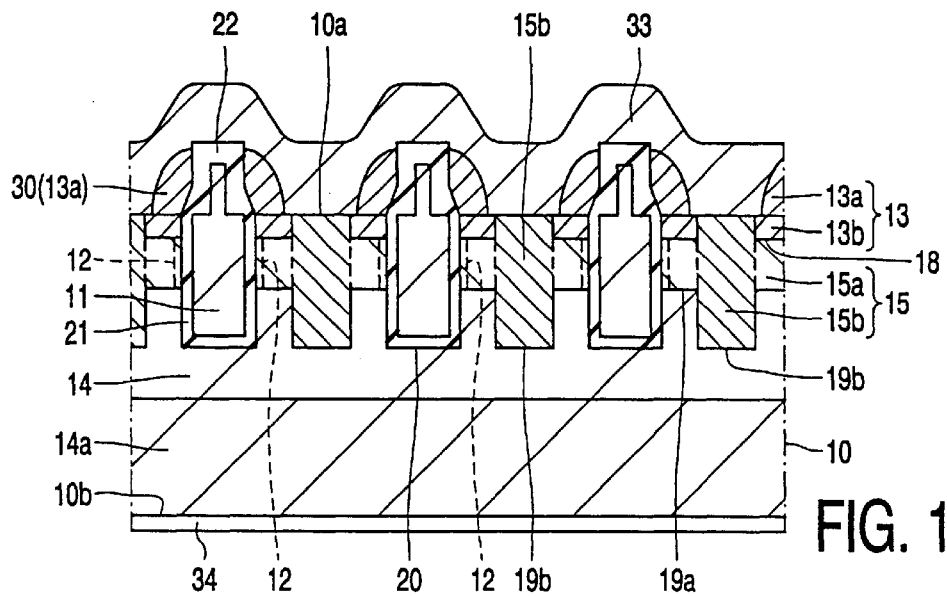

FIG. 10 illustrates an exemplary embodiment of a cellular power semiconductor device having a trench-gate 11. In the transistor cell areas of this device, a channel-accommodating portion 15a of a body region 15 of a first conductivity type (i.e. p-type in this example) separates source and drain regions 13 and 14, respectively, of an opposite second conductivity type (n-type in this example). The gate 11 is present in a trench 20 which extends through the regions 13 and 15 into an underlying portion of the drain region 14. The application of a voltage signal to the gate 11 in the on-state of the device serves in known manner for inducing a conduction channel 12 in the region portion 15a and for controlling current flow in this conduction channel 12 between the source and drain regions 13 and 14. The source region 13 is located adjacent to the top major surface 10a of the device body and is contacted by a source electrode 33. By way of example, FIG. 10 shows a vertical device structure in which the region 14 may be a drain-drift region formed by an epitaxial layer of high resistivity on a substrate region 14a of high conductivity. This substrate region 14a may be of the same conductivity type (n-type in this example) as the region 14 to provide a vertical MOSFET, or it may be of opposite conductivity type (p-type in this example) to provide a vertical IGBT. The substrate region 14a is contacted at the bottom major surface 10b of the device body by an electrode 34, called the drain electrode in the case of a MOSFET and called the anode electrode in the case of an IGBT. Typically the device body is of monocrystalline silicon, and the gate 11 is typically of conductive polycrystalline silicon.

The device of FIG. 10 is manufactured by a method which, in overview, includes the following steps:

forming an upstanding insulated trench-gate structure 11,21,22 at a major surface 10a of a semiconductor body 10 (FIG. 5), a body region 15' of the first conductivity type extending adjacent to the insulated trench-gate structure 11,21,22 to provide the channel-accommodating portion 15a of the device, providing a sidewall extension 30 at upstanding sides of the insulated trench-gate structure 11,21,22 to form a step with an adjacent surface area 10a' of the region 15', the sidewall extension 30 comprising doped semiconductor material 13a of opposite, second conductivity type which is separated from the gate 11 by insulating material 22 and which provides the source region 13 (FIG. 7), forming a localised high-doped portion 15b by introducing dopant 46 of the first conductivity type into the semiconductor body 10 via the said adjacent surface area 10a' while using the sidewall extension 30 comprising the doped semiconductor material 13a to mask an underlying area of the body 10 (FIG. 7), and depositing electrode material for the source electrode 33 over the step so as to contact the doped semiconductor material 13a of the sidewall extension 30 and the adjacent surface area 10a' of the first conductivity type (FIG. 10).

It is the high-doped portion 15b of the body region 15 that is contacted by the source electrode 33 at the said adjacent surface area 10a'. This high-doped portion 15b has a doping concentration (P+) of the first conductivity type which is higher than that (P) of the channel-accommodating portion 15a but lower than the conductivity-determining dopant concentration (N++) of the doped semiconductor material 13a of the sidewall extension 30 that provides the source region 13. The high-doped portion 15b is provided to a greater depth in the semiconductor body 10 than the p-n junction 18 between the source region 13 and the channel-accommodating portion 15a of the body region 15, and is preferably even deeper (as illustrated in FIGS. 7 to 10) than the p-n junction 19a between the channel-accommodating portion 15a and the underlying drain region 14.

Figure 6:
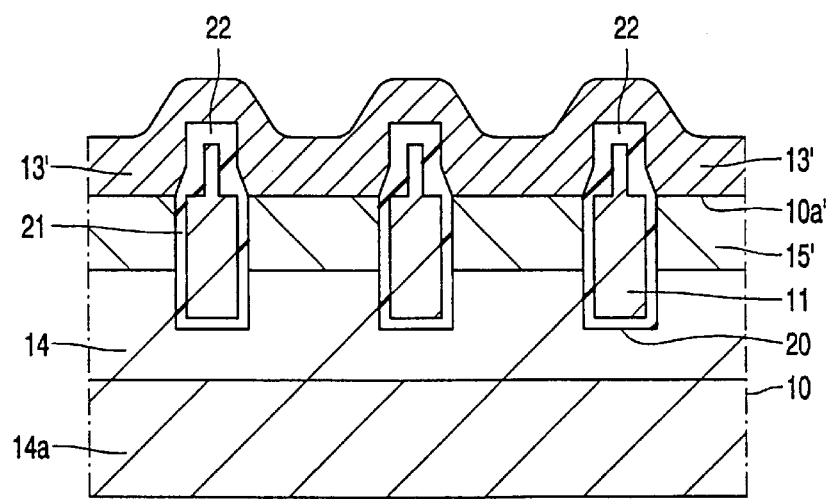

In a typical embodiment, the doping concentration (P+) of the high-doped portion 15b may be, for example, $10^{18}$ to $10^{19}$ boron atoms $cm^{-3}$, that (P) of the channel-accommodating portion 15a may be, for example, $10^{16}$ to $10^{17}$ boron atoms $cm^{-3}$, and the conductivity-determining dopant concentration (N++) of the doped semiconductor material 13a of the sidewall extension 30 may be, for example, $10^{20}$ to $10^{22}$ phosphorus or arsenic atoms $cm^{-3}$. In such an embodiment, the depth (below the surface area 10a') of the high-doped portion 15b may be, for example, 1.5 µm to 3 µm (micrometres), whereas those of the source p-n junction 18 and drain p-n junction 19a with the channel-accommodating portion 15a may be, for example, 0.1 µm to 0.6 µm and 1 µm to 2 µm, respectively. The depth of the trench 20 may be, for example, 1.5 µm to 3 µm. The bulk of the source region 13 in the device of FIG. 10 is of doped polycrystalline silicon material 13a deposited on the body surface 10a (FIG. 6). The height of the doped sidewall extension 30 (source region material 13a) which is retained above the surface 10a may be, for example, 0.5 µm to 1.5 µm This arrangement permits the realisation of a device with a very shallow depth for the p-n junction 18 between the source region 13 and the channel-accommodating portion 15a, while using doped semiconductor material 13a of high conductivity in the step so as to avoid a high resistance in this shallow source region 13. Thus, the device can be made with a short channel length 12 and so with a low on-resistance between the source and drain regions 13 and 14. Furthermore, the breakdown voltage of the device can be determined by avalanche breakdown of the deep p-n junction 19b between the deep localised high-doped portion 15b and the underlying region 14, rather than by avalanche breakdown of the shallower p-n junction 15a formed by the channel-accommodating portion 15a.

Successive stages in the fabrication of the transistor cells will now be described with reference to the sequence of FIGS. 1 to 10, by way of example of a specific embodiment. Self-aligned techniques are used in this embodiment, so reducing the requirement for separate mask alignments. Indeed the embodiment of FIGS. 1 to 10 is so designed that all the subsequent masking steps in the cell areas shown in FIGS. 3 to 10 can be determined in a self-aligned manner from the mask provided in FIG. 2. This self-alignment permits a reproducible close spacing of the transistor cells, for example with a cell pitch of less than 5 $\mu$m, i.e. with a spacing of 5 $\mu$m (or less) between centres of the neighbouring trenches 20.

No plan view of the cellular layout geometry is shown in the drawings, because the method of FIGS. 1 to 10 may be used for quite different, known cell geometries. Thus, for example the cells may have a square geometry as illustrated in FIG. 14 of U.S. Pat. No. 5,378,655, or they may have a close-packed hexagonal geometry or an elongate stripe geometry. In each case, the trench 20 (with its gate 11) extends around the boundary of each cell. FIG. 10 shows only a few cells, but typically the device comprises many thousands of these parallel cells between the electrodes 33 and 34. The active cellular area of the device may be bounded around the periphery of the body 10 by various known peripheral termination schemes (also not shown). Such schemes normally include the formation of a thick field-oxide layer at the peripheral area of the body surface 10a, before the transistor cell fabrication steps. Furthermore, various known circuits (such as gate-control circuits) may be integrated with the device in an area of the body 10, between the active cellular area and the peripheral termination scheme. Typically their circuit elements may be fabricated with their own layout in this circuit area using some of the same masking and doping steps as are used for the transistor cells.

FIG. 1 illustrates an early stage in the manufacture, wherein a p-type region 15' is formed in the low-doped n-type region 14 of the body 10 by implantation of acceptor dopant ions 45, for example of boron. A thin layer 50 of silicon dioxide may be grown on the silicon body surface 10a, before implanting the ions 45. The implantation is carried out in the active cellular area defined by a window in the thick field-oxide layer (not shown). At this stage (and/or during and/or after the deposition of further layers such as the layers 51 and 52) a heating step may be carried out to anneal the implant and possibly also to diffuse the implanted dopant to the desired depth for the region portion 15a in the body 10.

Figure 2:
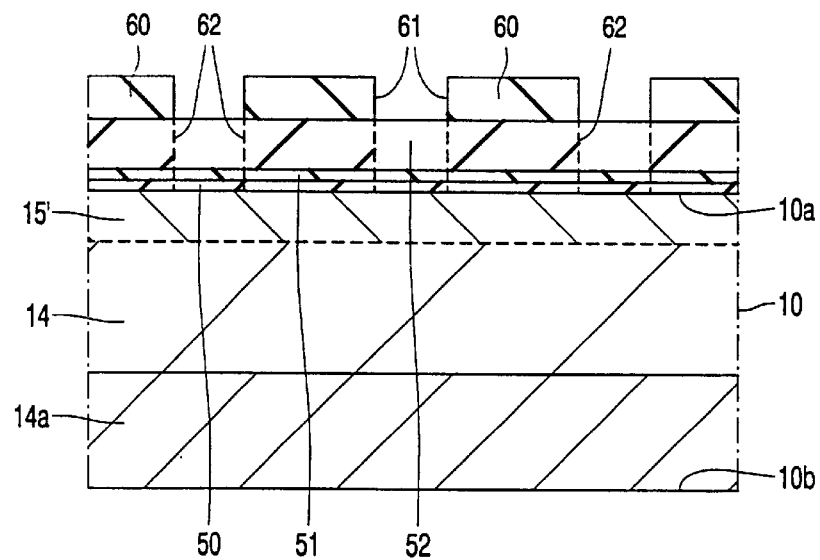

As illustrated in FIG. 2, a thin layer 51 of silicon nitride is now deposited on the thin layer 50 of silicon dioxide, followed by a thicker layer 52 of silicon dioxide. Typically, the nitride layer 51 may have a thickness in the range of 0.1 $\mu$m to 0.2 $\mu$m, whereas the oxide layer 52 is an order of magnitude thicker, for example 1 $\mu$m–1.5 $\mu$m. Using known photolithography, a photo-resist mask 60 is now provided on the thick oxide layer 52. In the case of a device with an hexagonal cell geometry, this photo-resist mask 60 has a close-packed hexagonal dot pattern. It has windows 61 which define the layout pattern for the trenchgate 11 of the device. As illustrated by broken outline in FIG. 2, the insulating layers 52, 51 and 50 are etched away at these windows 61 in the photo-resist pattern 60. In this way, a grid-shaped window 62 is etched in the layers 50, 51 and 52 which form a mask 65 of insulating material at the major surface 10a of body 10. This mask 65 (50, 51, 52) comprises a thicker second layer 52 of a second material (silicon dioxide) on a thinner first layer 51 of an oxidation-masking first material (silicon nitride). The window 62 in this mask 65 is now used to form the upstanding insulated trench-gate structure 11, 21 and 22.

Figure 3:
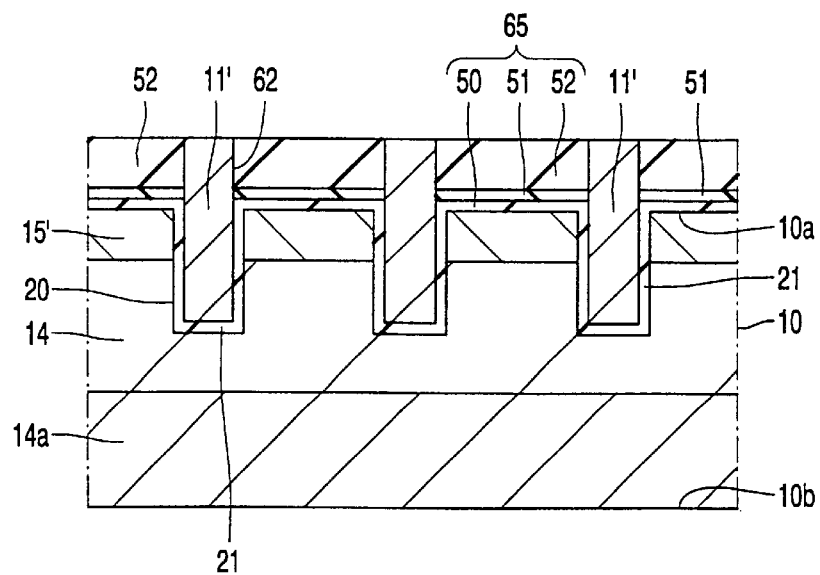

First, the trench 20 is etched into the body 10 at the window 62. The photo-resist mask 60 may still be present during this trench etching stage which may continue directly from the etching of the window 62. The trench 20 is etched into the drain region 14, i.e. to a depth greater than the thickness of the region 15'. After removing the photoresist mask 60, the silicon body 10 is subjected to an oxidation treatment to form a thin silicon dioxide layer 21 on the exposed faces of the trench 20. The trench-gate material is now provided in known manner, by depositing doped polycrystalline silicon material 11' to fill the oxidised trenches 20 and windows 62 and to cover the surface of the mask 65 (50, 51, 52). The deposited silicon material 11' is then etched back from the surface of the mask 65 (50, 51, 52) until it is left only in the trench 20 and the window 62. The resulting structure is illustrated in FIG. 3.

Figure 4:
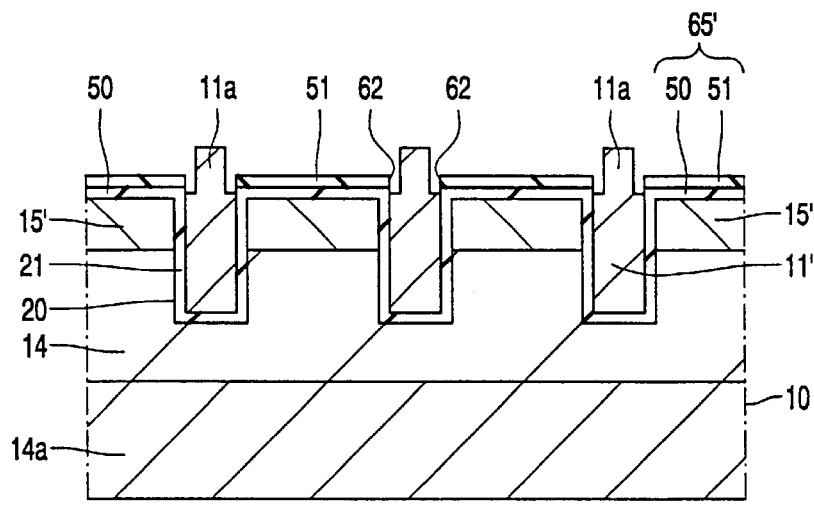

The thick oxide layer 52 is now removed, before using the thinner layer 51 of the oxidation-masking material (silicon nitride) to mask an oxidation treatment which forms an insulating layer 22 of silicon dioxide at an upper part 11a of the doped silicon gate material 11'. As illustrated in FIG. 4, this upper part 11a of the gate material 11' is preferably etched back from the sides of the window 62 to leave the doped silicon gate material 11' upstanding within the window 62 before forming the insulating layer 22 by oxidation. This etch-back exposes the polysilicon side area of the upper part 11a where it locally faces the masking layer 21 and so facilitates the smooth and reliable growth of oxide layer 22 to an adequate thickness at this side area in the following oxidation treatment. Typically, a thickness of between 0.1 $\mu$m and 0.2 $\mu$m of polycrystalline silicon may be removed from the upper part 11a by means of this etch-back treatment.

Figure 5:
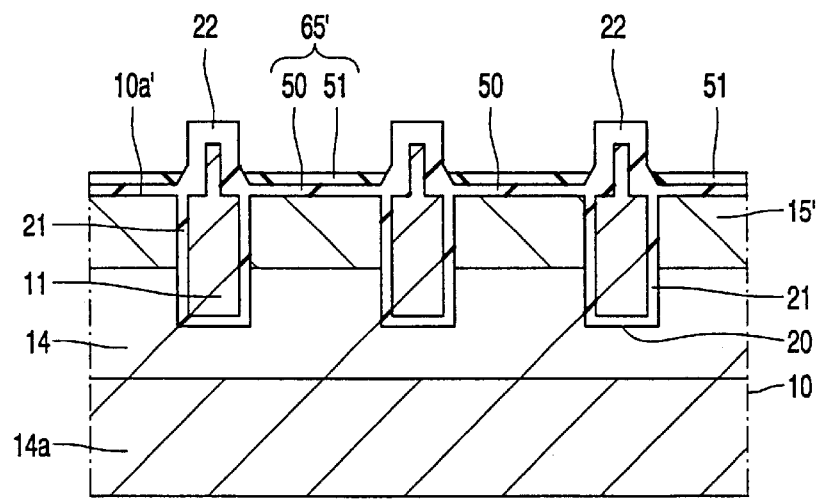

As illustrated in FIG. 5, an oxidation treatment is now carried out to form an insulating overlayer 22 of silicon dioxide over the gate 11 in the trench 20. The silicon body areas between the trenches 20 are protected against oxidation by the silicon nitride layer 51. The resulting structure is illustrated in FIG. 5. The thickness of the insulating overlayer 22 may be, for example, in the range of 0.1 $\mu$m to 0.2 $\mu$m After etching away the layers 50 and 51 from the surface 10a, doped silicon source material 13' is deposited on the upstanding insulated trench-gate structure 11, 21, 22 and on the body region 15' at the exposed surface 10a. The resulting structure is illustrated in FIG. 6. The thickness of the deposited source material 13' may be in the range of, for example, 0.5 $\mu$m to 1.5 $\mu$m. The donor dopant concentration of this source material 13' may be in the range of, for example, $10^{20}$cm$^{-3}$ to $10^{22}$cm$^{-3}$.

Figure 7:
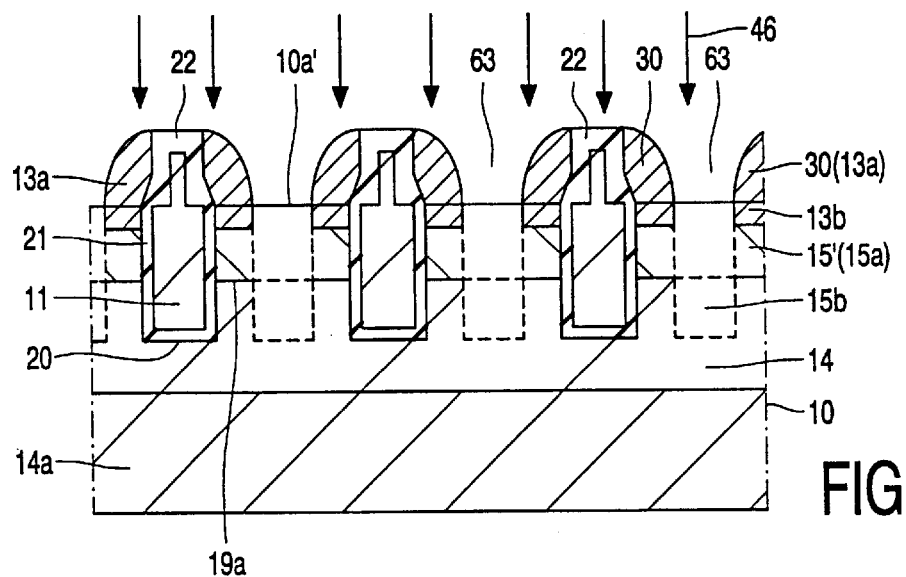

The layer of deposited source material 13' is now etched-back to leave only the material 13a as a sidewall extension 30 at the sides of the upstanding insulated trench-gate structure 11, 21, 22. These doped sidewall extensions 30 are illustrated in FIG. 7. The sidewall extensions 30 are now used as an implantation mask over the underlying areas of the body 10, while implanting dopant ions 46 (for example of boron) into the body 10 for forming the localised high-doped portion 15b of the body region 15. Typically, a dose of $10^{14}$ to $5 \times 10^{15}$ cm$^{-2}$ of boron ions may be used for this implantation. The implantation dose is insufficient to over-dope the donor concentration of the sidewall extensions 30 which are to provide at least the bulk of the source region 13. Either before, during or after this implantation, the body 10 may be heated to a dopant diffusion temperature for diffusing some of the dopant from the sidewall extension 30 into the body 10. In this way, the p-n junction 18 of the source region 13 can be moved away from the interface of the deposited doped material 13a and the major surface 10a of the body 10. A higher quality p-n junction can be obtained by moving away from this interface. The temperature at which the implanted dopant 46 is annealed in the body 10 may also be such as to give rise to some diffusion of the p-n junction 18 as well as the implanted localises portion 15b. As illustrated in FIG. 7, the localised high-doped portion 15b is preferably implanted and/or diffused to a depth in the body 10 which is greater than the depth of the p-n junction 19a formed by the region 15'. The channel-accommodating portion 15a of the body region 15 is formed by the remaining portion of this region 15'.

Figure 8:
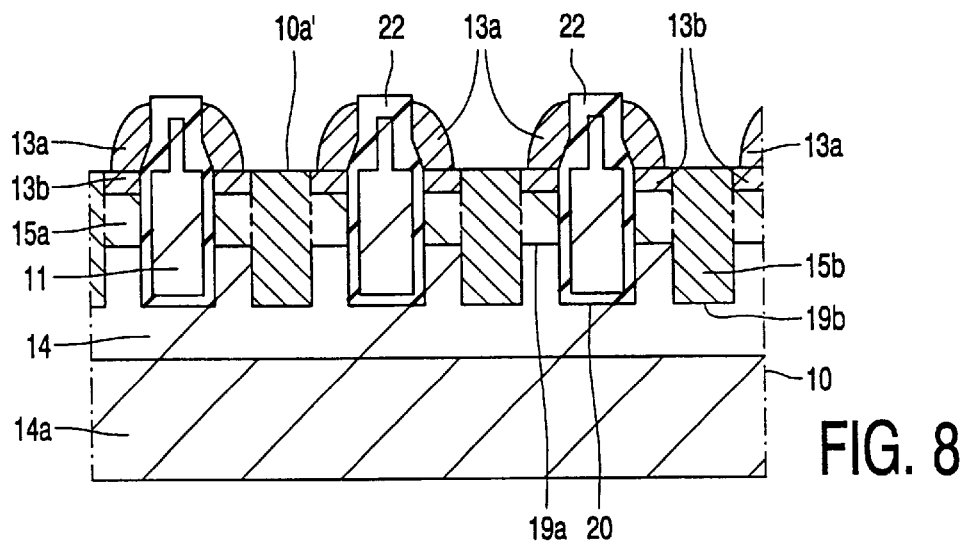
Figure 9:
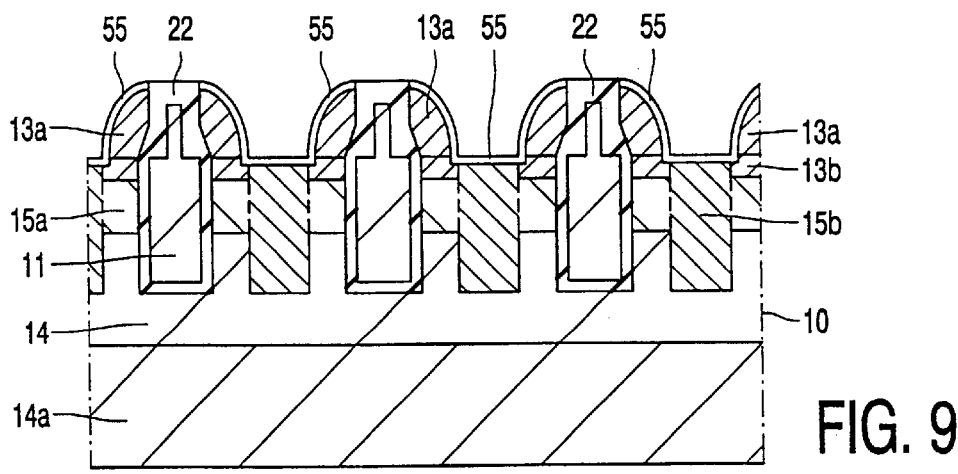

FIGS. 8 and 9 illustrate two optional treatments which may be carried out before depositing the source electrode material. As illustrated in FIG. 8, the doped polycrystalline material 13a of the sidewall extension 30 may be etched back slightly so as to expose a peripheral area of the doped source portion 13b formed in the body 10. Furthermore, as illustrated in FIG. 9, a silicide-forming metal 55 (for example tungsten) may be deposited to form a low-resistance silicide contact both to the doped semiconductor material 13a of the sidewall extension 30 and to the adjacent surface area 10a' of the high-doped portion 15b (and the peripheral area of the doped source portion 13b, if exposed). Since tungsten will not react with silicon dioxide, it only forms the silicide with these silicon regions 13a and 10a', so providing a very low sheet resistance for these contacts. Finally, a thick layer of main electrode material (for example aluminum) is deposited to form the source electrode 33.

This process of FIGS. 1 to 10 is particularly suitable for manufacturing devices with a small pitch size and with shallow source and body junctions 18 and 19a. The deposited N++ polycrystalline silicon 13a acts directly as a source region of the device, as well as an implant mask for the deep high-doped body portion 15b. The process eliminates a source implant step and also saves a photolithographic step for defining the deep body portion 15b.

Figure 11:
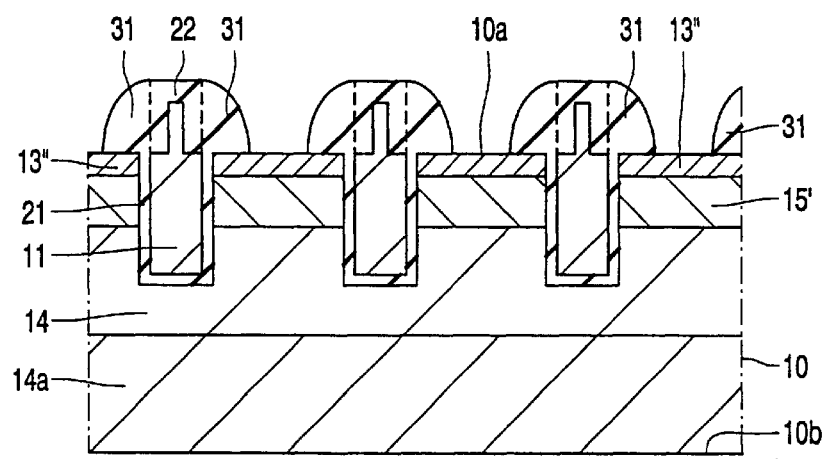
FIGS. 11 and 12 are a cross-sectional view of the transistor cell areas of FIG. 7 at successive stages in a modified manufacturing method which is also in accordance with the invention.
Figure 12:
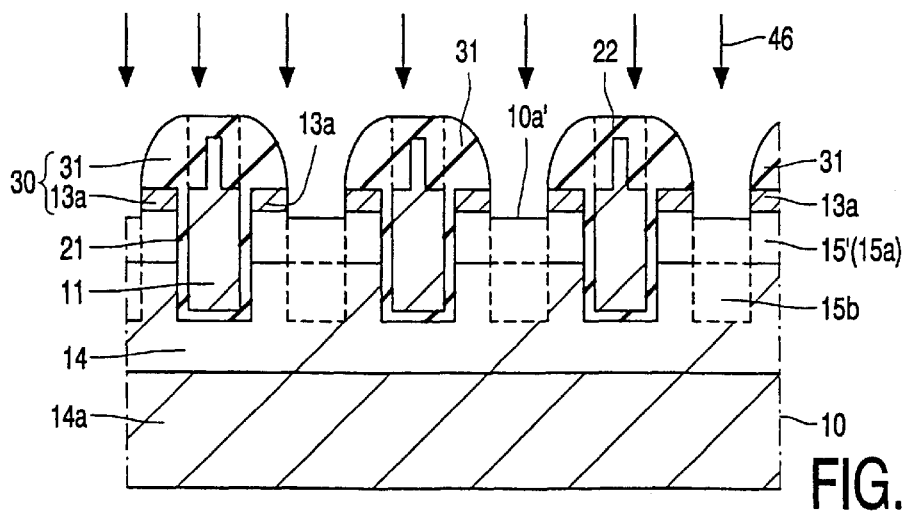

FIGS. 7 to 10 illustrate the high-doped portion 15b as extending deeper than the p-n junction 19a of the channel-accommodating portion 15a, but not extending beyond the bottom of the trench-gate 11. In order to avoid a premature breakdown at a bottom corner of the trench 20, it can be advantageous for the high-doped portion 15b to extend beyond the bottom of the trench-gate 11. This can be achieved in the embodiment of FIGS. 1 to 10 by using a higher step for the sidewall extension 30 and for the upstanding insulated gate structure 11, 21, 22 and using a higher implantation dose and energy for the dopant ions 46. FIGS. 11 and 12 illustrate another situation in which a higher step can be provided. In this case, the source region 13 is formed by etching into the major surface 10a of the body 10 through a surface region 13" of the body 10.

In this modified process, the upstanding insulated trench-gate structure 11, 21, 22 is formed extending through an n-type region 13' of the body 10 as well as through the p-type region 15'. The surface region 13" may be formed by implantation and/or diffusion of phosphorus or arsenic in the body 10 to a concentration of at least $5 \times 10^{20}$ cm$^{-3}$. Initially, a sidewall extension 31 of silicon dioxide is provided at the upstanding sides of the insulated trench-gate structure 11, 21, 22. This silicon dioxide sidewall extension 31 can be formed using process steps similar to those described in U.S. Pat. No. 5,378,655. This silicon dioxide sidewall extension 31 covers an area 13a of the surface region 13". The structure is illustrated in FIG. 11.

As illustrated in FIG. 12, the silicon dioxide sidewall extension 31 is now used as an etchant mask while etching into the surface 10a of body 10 through the thickness of the surface region 13". In this way, a lower surface area 10a' is formed, exposing the p-type region 15'. The area 13a of the surface region 13" adjacent to the upstanding insulated trench-gate structure 11, 21, 22 is masked by the silicon dioxide sidewall extension 31 and so is retained to form the source region 13 of the device.

FIG. 12 also illustrates the dopant introduction stage for forming the localised high-doped portion 15b. This may be effected by implantation of boron ions 46, in a manner similar to that of FIG. 7. However, in the FIG. 12 situation, the stepped sidewall extension 30 comprises both the doped source region 13a and the silicon dioxide masking portion 31. This step may have a considerable height, permitting a deeper implant of the region portion 15b. Thus, by way of example, FIG. 12 illustrates the high-doped portion 15b being provided to a greater depth in the body 10 than the bottom of the trench 20. In this modified process, the silicon dioxide sidewall extension 31 is etched back (or even etched fully away) before depositing the source electrode 33 to contact both the source region 13a and the body region 15.

It will be evident that many variations and modifications are possible within the scope of the present invention. FIG. 1 illustrates the preferred situation in which the p-type region 15' for the channel-accommodating portion 15a is provided in the body 10 before the upstanding insulated trench-gate structure 11, 21, 22. However, a modified process is possible in which this region 15' is provided in the body 10 after the insulated trench-gate structure 11, 21, 22.

In FIG. 5, the insulating over-layer 22 is formed by oxidising the upper part 11a of the gate electrode material 11'. However, an insulating over-layer 22 over a trench-gate 11 may be formed alternatively by deposition of silicon dioxide or another insulating material. Usually, the conductive gate 11 is formed of doped polycrystalline silicon, as described above. However, other known gate technologies may be used in particular devices. Thus, for example, other materials may be used for the gate, such as a thin metal layer which forms a silicide with the polycrystalline silicon material. Alternatively, the whole gate 11 may be of a metal instead of polycrystalline silicon. FIG. 10 illustrates the preferred situation in which the conductive gate 11 is capacitively coupled to the channel-accommodating region portion 15a by a dielectric layer 21. However, so-called Schottky gate technologies may alternatively be used in which a gate dielectric layer 21 is absent and in which the conductive gate 11 is of a metal that forms a Schottky barrier with the low-doped channel-accommodating portion 15a. The Schottky gate 11 is capacitively coupled to the channel-accommodating portion 15a by the depletion layer present at the Schottky barrier. The insulating over-layer 22 is provided on this Schottky gate 11 so as to form the desired upstanding insulated trench-gate structure 11, 22.

The embodiments of FIGS. 1 to 10 and of FIGS. 11 and 12 are both for trenchgate devices, for which the invention is particularly advantageous. However, the present invention may also be used for the manufacture of planar/surface-gate devices in which the conductive gate 11' is a planar layer on a gate insulating layer 21' on the major surface 10a of the device body 10. An insulating overlayer 22' is present on top of the gate 11' and over the sidewalls of the gate 11'. In this case, the upstanding sides of the planar gate structure 11',21',22' at the major surface 10a are formed by the insulating overlayer 22' extending over the sidewalls of the gate 11'. It is at these upstanding sides that the sidewall extension 13a' comprising the doped source material is provided. This sidewall extension 13a' comprising the doped source material is subsequently used to mask the dopant introduction 46 for providing the deep body portion 15b in accordance with the present invention.

The particular example described above is an n-channel device, in which the regions 13 and 14 are of n-type conductivity, the region portions 15a and 15b are of p-type and an electron inversion channel 12 is induced in the region portion 15a by the gate 11. By using opposite conductivity-type dopants, a p-channel device can be manufactured by a method in accordance with the invention, in which the regions 13 and 14 are of p-type conductivity, the region portions 15a and 15b are of n-type, and a hole inversion channel 12 is induced in the portion 15a by the gate 11.

From reading the present disclosure, other variations and modifications will be apparent to persons skilled in the art. Such variations and modifications may involve equivalent and other features which are already known in the design, manufacture and use of semiconductor devices and component parts thereof and which may be used instead of or in addition to features already described herein.

Although Claims have been formulated in this Application to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any Claim and whether or not it mitigates any or all of the same technical problems as does the present invention.

The Applicants hereby give notice that new Claims may be formulated to any such features and/or combinations of such features during the prosecution of the present Application or of any further Application derived therefrom.

Thus, for example, as well as the invention set out in the following Claims, there is also disclosed a method of manufacturing a trench-gate semiconductor device having a channel-accommodating region 15a adjacent to an insulated trench-gate structure 11,22, wherein the insulated trench-gate structure 11,22 is formed in a novel manner by steps which include:

etching a trench 20 in a semiconductor body 10 at a window 62 in a mask 51,52 at a major surface 10a of the semiconductor body, the mask comprising a thicker second layer 52 of a second material on a thinner first layer 51 of an oxidation-masking first material, depositing doped semiconductor gate material 53 in the trench 20 to form the trench-gate 11, etching back the doped semiconductor gate material 53 from the mask 51,52 and also etching it back from sides of the window 62 (either before or after removing the layer 52 of the mask) so as to leave an upper part 11a of the doped semiconductor gate material 11 freely upstanding within the window 62, and forming an insulating layer 22 at the freely upstanding upper part 11a of the doped semiconductor gate material 11 by oxidation after removing the layer 52 from the mask 51,52.

What is claimed is:

1. A method of manufacturing a semiconductor power device having a trench-gate capacitively coupled to a channel-accommodating portion of a body region of a first conductivity type, including the steps of:

(a) providing at a major surface of a semiconductor body where the body region is provided a mask that comprises a thicker second layer of a second material on a thinner first layer of an oxidation-masking first material, the mask having a window where the trench-gate is to be provided in the semiconductor body, (b) etching a trench in the semiconductor body at the window, (c) providing the trench-gate in the trench and in the window by steps that include depositing doped semiconductor gate material on the mask and in the window and etching away the doped semiconductor gate material from on top of the mask, (d) removing the second layer from the mask and then etching back the doped semiconductor gate material from sides of the window in the first layer so as to leave the doped semiconductor gate material freely upstanding within the window, (e) oxidising an upper part of the doped semiconductor gate material, while using the first layer as an oxidation mask, so as to form an upstanding insulated gate structure that has an insulating overlayer and that protrudes above the major surface of the semiconductor body, (f) removing the first layer and then forming a sidewall extension at upstanding sides of the insulated gate structure so as to form a step with an adjacent surface area of the body region of the first conductivity type, the sidewall extension comprising doped semiconductor material of opposite, second conductivity type which is insulated from the trench-gate and which provides a source region of the device, the source region forming a p-n junction with the channel-accommodating portion, (g) introducing dopant of the first conductivity type into the semiconductor body via the said adjacent surface area while using the sidewall extension to mask an underlying area of the semiconductor body, and thereby to provide the body region with a localised high-doped portion that has a doping concentration of the first conductivity type which is higher than that of the channel-accommodating portion but lower than the conductivity-determining dopant concentration of the doped semiconductor material of the sidewall extension that provides the source region, which high-doped portion is provided to a greater depth in the semiconductor body than the p-n junction between the source region and the channel-accommodating portion of the body region, and (h) depositing a source electrode over the step so as to contact the doped semiconductor material of the sidewall extension and the high-doped portion of the body region at the adjacent surface area of the semiconductor body.

2. A method as claimed in claim 1, further characterised in that the depositing step further comprises doped semiconductor source material of the second conductivity type deposited on the gate structure and on the body region of the first conductivity type at said major surface and is etched back to leave the sidewall extension as the source region.

3. A method as claimed in claim 2, further characterised in that dopant from the doped semiconductor source material of the sidewall extension is diffused into the semiconductor body by heating the semiconductor body to a dopant diffusion temperature, so as to move the p-n junction between the source region and the channel-accommodating portion away from the interface of the deposited doped semiconductor material and the major surface of the semiconductor body.

4. A method as claimed in claim 1, further characterised in that the doped semiconductor material of the sidewall extension comprises silicon, the semiconductor body at least adjacent to said major surface comprises silicon, and in that the method further comprises depositing a silicide-forming metal to form a low-resistance silicide contact both to the doped semiconductor material of the sidewall extension and to the adjacent surface area of the high-doped portion before depositing a main electrode material for the source electrode.

5. A method as claimed in claim 1, further characterised in that the method further comprises forming the doped semiconductor material of the sidewall extension by etching into said major surface of the body through a surface region of the second conductivity type adjacent said major surface while masking an area of said surface region adjacent to the gate structure to form the source region.

6. A method as claimed in claim 5, further characterised in that a masking pattern which masks said area of said surface region to form the source region is present as part of the sidewall extension when the dopant introduction for forming the localised high-doped portion is effected.

7. A method as claimed in claim 1, further characterised in that the method further comprises providing the localised high-doped portion to a greater depth in the semiconductor body than the channel-accommodating portion.

8. A method as claimed in claim 1, further characterised in that the method further comprises implanting the dopant of said first conductivity type for forming the localised high-doped portion into the semiconductor body while using the sidewall extension as an implantation mask over the underlying area of the body.

9. In a method of manufacturing a trench-gate semiconductor device having a channel-accommodating region adjacent to an insulated trench-gate structure, the insulated trench-gate structure is formed by steps that include:

etching a trench in a semiconductor body at a window in a mask at a major surface of the semiconductor body, the mask comprising a thicker second layer of a second material on a thinner first layer of an oxidation-masking first material, depositing doped semiconductor gate material on the mask and in the window for providing the trench-gate, removing the doped semiconductor gate material from on top of the mask and removing the second layer of the mask so as to leave the doped semiconductor gate material upstanding in the trench and in the window in the first layer of the mask, etching back the doped semiconductor gate material from sides of the window in the first layer so as to leave an upper part of the doped semiconductor gate material freely upstanding within the window in the first layer, and forming an insulating layer at the freely upstanding upper part of the doped semiconductor gate material by oxidation while using the first layer to mask an adjacent surface area of the body.

10. A method as claimed in claim 9, wherein the channel-accommodating region of the device is provided as a region of a first conductivity type in the semiconductor body, and wherein, after forming the insulating layer at the freely upstanding upper part of the doped semiconductor gate material, the first layer of the mask is removed and a sidewall extension comprising doped semiconductor material of opposite, second conductivity type is formed at upstanding sides of the trench-gate structure, which sidewall extension provides a source region of the device that is separated from the trench-gate by the insulating layer.

* * * * *